United States Patent [19]

Rozenblit

[11] Patent Number: 5,604,461
[45] Date of Patent: Feb. 18, 1997

[54] TRANSFORMERLESS OUTPUT VACUUM TUBE AUDIO AMPLIFIER

[76] Inventor: Bruce M. Rozenblit, 7244 Madison, Kansas City, Mo. 64114

[21] Appl. No.: 589,731

[22] Filed: Jan. 22, 1996

[51] Int. Cl.$^6$ ............................... H03F 1/36; H03F 3/28
[52] U.S. Cl. ................................. 330/81; 330/82
[58] Field of Search .............................. 330/81, 82, 83, 330/118, 119; 381/120, 121

[56] References Cited

U.S. PATENT DOCUMENTS

| | | | |
|---|---|---|---|
| 2,773,136 | 12/1956 | Futterman | 179/171 |
| 2,802,907 | 8/1957 | Peterson et al. | 330/81 |
| 3,123,780 | 3/1964 | Futterman | 330/74 |

OTHER PUBLICATIONS

Amemiya, Hiroshi: An Output Transformerless Amplifier, Journal of the AES, Apr., 1956.
Amemiya, Hiroshi: Analysis of Drivers for Single–Ended Push–Pull Stage, I.R.E. Trans. on Audio, Sept.–Oct., 1955.
Peterson and Sinclair: A Single–Ended Push–Pull Audio Amplifier, Proc. I.R.E., Jan., 1952.
Futterman, Julius: Practical Commercial Output Transformerless Amplifier, Journal of the A.E.S., Oct., 1956.
Futterman, Julius: An Output–Transformerless Power Amplifier, Journal of the A.E.S., Oct., 1954.
Onder, K.: A New Transformerless Amplifier Circuit, Journal of the A.E.S., Oct., 1953.
Brociner and Shirley: The OTL Amplifier, Audio Engineering, Jun., 1952.
Unknown Output Transformerless Amplifiers, Wireless World, Feb., 1957.
Dickie and Macovski: A Transformerless 25–Watt Amplifier, Audio, Jun., 1954.

*Primary Examiner*—Steven Mottola

[57] ABSTRACT

An audio amplifier including a series connected vacuum tube output stage for driving an audio loudspeaker. The preferred amplifier uses the output signal as a floating reference for an intermediate stage to prevent output stage degeneration for producing balanced push-pull drive signals, thereby eliminating the need for an output transformer or AC coupling.

20 Claims, 4 Drawing Sheets

FIGURE 1 – PRIOR ART

TRANSFORMERLESS OUTPUT VACUUM TUBE AUDIO AMPLIFIER

BACKGROUND—FIELD OF THE INVENTION

The present invention relates to the field of audio electronics and more particularly, to an audio power amplifier using a vacuum tube, series connected push-pull output stage for amplifying audio signals to drive a high fidelity loudspeaker.

BACKGROUND—DESCRIPTION OF PRIOR ART

In the field of audio electronics, the primary objective is to achieve faithful and accurate sound reproduction. Those individuals skilled in the art appreciate that vacuum tube-based audio equipment has sonic characteristics that are greatly desired by many audiophiles. One limitation of the traditional vacuum tube amplifier has been the necessity of an output transformer to provide impedance matching between the high impedance of the output stage and the low impedance of the loudspeaker. The output transformer is expensive to produce, and introduces a source of distortion and coloration into the sound. Specifically, the output transformer reduces the three dimensional imaging of the sound field—a characteristic highly sought after by audiophiles.

Prior art attempts to produce practical transformerless output vacuum tube amplifiers have been generally unsuccessful because of the following limitations:

(a) Extreme heat output—Waste heat output is more than double that of conventional transformer coupled amplifiers. Heat outputs for a typical 100 watt transformerless output amplifier range from 600 to 800 watts per channel. This is intolerable in a residential environment.

(b) Poor reliability—The output tubes are operated with high bias currents which greatly shortens tube life and stresses the tubes. High power transients push the tubes well beyond their maximum ratings. As a result, failures occur frequently.

(c) Poor bass sound—These types of amplifiers have always had a very weak and feeble bass sound when driving dynamic loudspeakers. It has been a commonly accepted adage in the audio industry that transformerless output amplifiers cannot supply bass drive equal to conventional transformer coupled amplifiers.

(d) DC instability—The DC level of the output stage is unstable forcing prior art designs to use an AC coupled output. The output capacitor increases cost, further reduces bass output because of its reactance and effective series resistance, and is audibly less desirable to audiophiles than a direct coupled connection to the loudspeaker.

The root cause of these problems has been the inability of prior art designs to provide truly balanced push-pull drive signals to the series connected output stage. The prior art techniques provide for equal amplitude push-pull drive signals but have unequal push-pull forward voltage gains. It is this gain unbalance that creates the conditions that cause these deficiencies.

SUMMARY OF THE INVENTION

The present invention solves the prior art problems discussed above and provides a distinct advance in the state of the art. More particularly, the transformerless vacuum tube audio amplifier hereof provides a truly balanced drive with equal push-pull drive voltage gains through the system without the use of an output transformer or output coupling capacitor. Other preferred aspects are discussed further.

OBJECTS AND ADVANTAGES

Accordingly, several objects and advantages of the present invention are:

(a) Low heat output—The waste heat output of the amplifier is comparable to that of a conventional transformer coupled design. The heat output of the 110 watt configuration is in the range of 325 watts per channel which is about 100 watts greater than a conventional transformer coupled amplifier and half as much as prior art designs.

(b) Excellent bass sound—The apparent bass sound of the amplifier is virtually indistinguishable from a conventional transformer coupled unit.

(c) Solidly reliable—The low heat output of the design relieves much stress on the output tubes allowing them to last much longer and greatly reduces failure rates.

(d) Reduced maintenance—Since the output tubes last much longer, tube maintenance is reduced. Also, chassis temperatures are lower, allowing the internal components to last longer.

(e) Direct coupled output—The amplifier employs a truly direct coupled output to the loudspeaker which acoustically, is the most desired type.

Further objects and advantages of the invention will become apparent from a consideration of the drawings and ensuing description.

DETAILED DESCRIPTION OF THE PREFERRED EMBODIMENT

To illustrate the improvements of this invention, a detailed analysis of the prior art is necessary.

Figure 1:
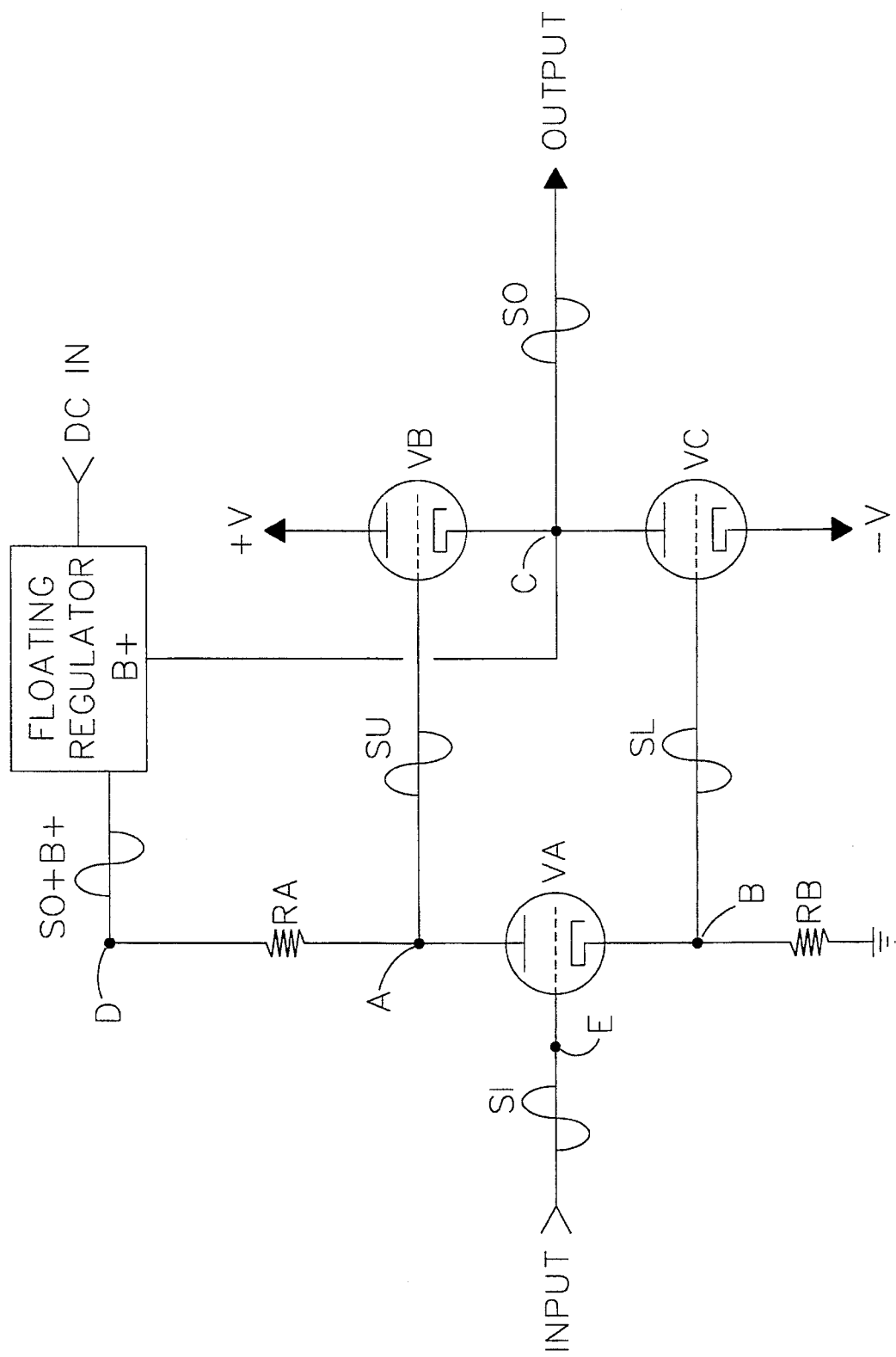
FIG. 1 is an electrical schematic of the prior art illustrating the inability to achieve a truly balanced drive.

FIG. 1 shows the typical prior art attempt to achieve a balanced drive. Bias circuitry has been omitted for clarity. Triodes VB and VC comprise the series connected output stage. Triode VA is a phase splitter used to generate two equal and out phase signals for driving the output stage. The gain of stage VA is essentially unity. The cathode of VC is at AC ground through the negative power supply.

The cathode of VB is not at ground potential. It floats on the output signal at node C. The drive signal for VB, SU, is in phase with the output signal SO. This causes degenerative feedback for the drive signal at node A. With no further compensation, the output stage is unbalanced.

The purpose of the Floating Regulator is to provide compensation for the degenerative feedback at node A. The Floating Regulator shown is a three terminal series pass type. Since the regulator is referenced to the signal output at node C, the potential applied at node D is the summation of the regulator's DC output voltage (B+) and the audio output signal. The signal applied to node D is in phase with the drive signal at node A. This provides the exact amount of signal boost or positive feedback required to overcome the degeneration of VB.

The prior art attempt to provide a balanced drive seems successful but it is not. This circuitry does provide balanced drive signal amplitudes for the output stage but it has unequal forward voltage gains through the system.

The drive signal SL at node B is essentially equal and in phase with signal SI at node E. Due to the action of phase splitter VA, signal SL is constrained to equal SI. The compensation signal applied at node D is out of phase with SL. This causes negative feedback to be applied to node B. Forward voltage gain is then consumed at node B. The output stage is unbalanced because the forward voltage gain at node A has been increased by the action of positive feedback and the forward voltage gain at node B has been decreased by the action of negative feedback.

The unbalanced forward voltage gains through the system have many detrimental effects on performance, particularly regarding bass performance. When making steady state measurements into a load resistor, bass response seems satisfactory as −3 db points at 10 Hz are easily obtainable. However, acoustic bass output is deficient.

The prior art technique as described above produces a DC offset in the output signal that is proportional to output signal amplitude. This pushes the loudspeaker cone in one direction which limits cone excursions reducing acoustic bass output. Bass drive requirements for reproducing music require large amplitude signals further exaggerating the problem.

The unequal forward voltage gains cause the amplifier's output impedance to differ between positive and negative going portions of the output signal. The damping factor is therefore unequal regarding compression and rarefaction strokes of the loudspeaker increasing the difficulty of the amplifier to control cone motion. These prior art deficiencies greatly reduce the acoustic bass output of the loudspeaker, which is easily apparent to those individuals skilled in the art.

A further complication caused by the unbalanced drive is increased distortion in the system. This has forced prior art designs to use large amounts of global negative feedback to reduce distortion and has also forced the use of high bias current operation for the output stage. Those individuals skilled in the art recognize that large amounts of global negative feedback decrease sonic quality particularly regarding imaging. Also, the large feedback consumes forward voltage gain thereby reducing the signal amplitude available to drive the output stage. This causes designers to opt for high bias current operation for the output stage because it requires less drive voltage. High bias current operation has the detrimental effects of causing DC instability requiring the use of an AC coupled output, greatly decreases tube life, and causes inefficiency that doubles the waste heat output over conventional transformer coupled designs.

All prior art attempts at achieving a balanced drive for the series connected output stage suffer from these performance limitations because they all apply the same compensation to both push-pull drive signals for the output stage causing unequal forward voltage gains through the system.

Figure 2:
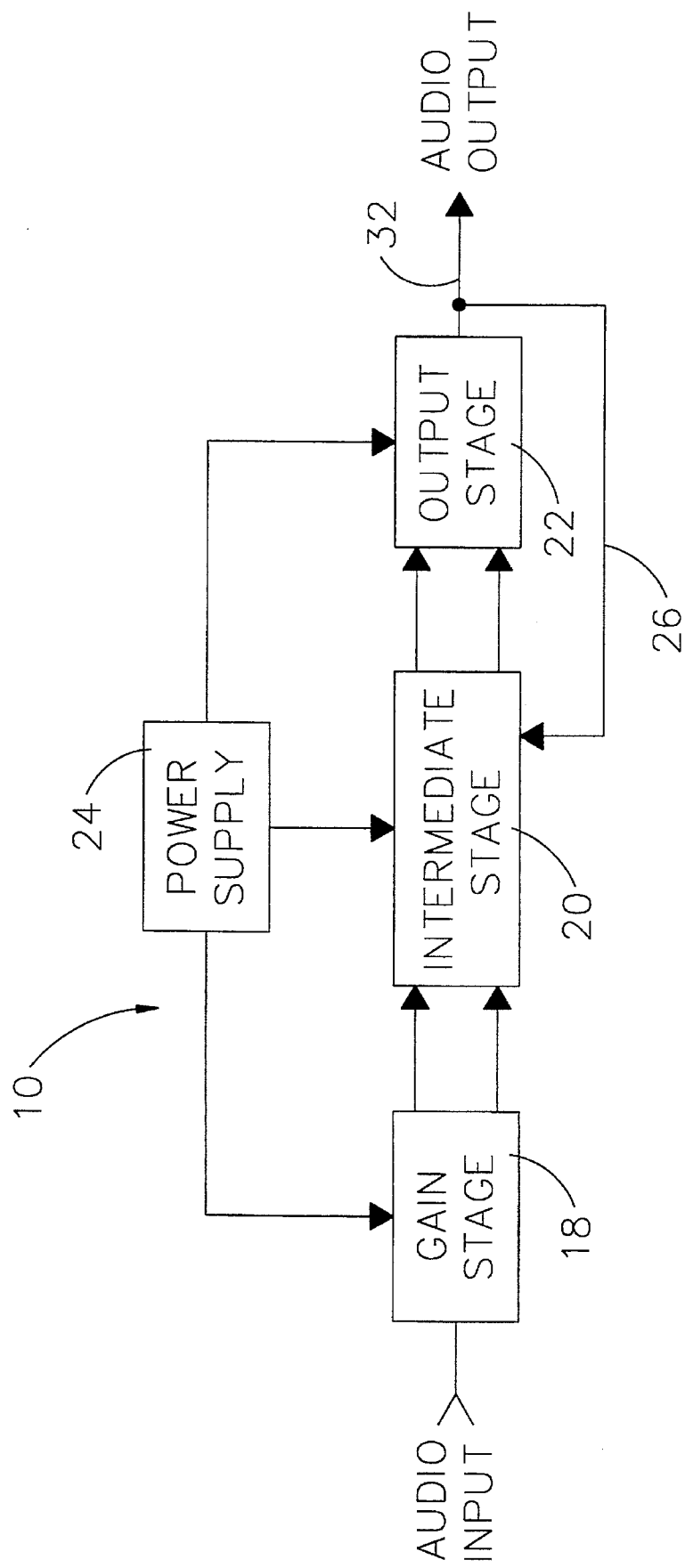
FIG. 2 is a block diagram illustrating the preferred amplifier design according to the present invention.

FIG. 2 illustrates the preferred vacuum tube audio amplifier 10. Amplifier 10 includes gain stage 18, intermediate stage 20, output stage 22 and power supply 24. Gain stage 18 provides all of the forward voltage gain for the amplifier as well as generates two split phase signals for driving the output stage. Intermediate stage 20 applies positive feedback 26 from the output line 32 to only one of the split phase signals and none to the other. In this manner, drive signal degeneration for the output tube whose cathode is coupled to the output line is eliminated. No feedback compensation is applied to the drive signal for the output tube whose cathode is coupled to ground through the power supply.

THE AMPLIFIER

Figure 3:
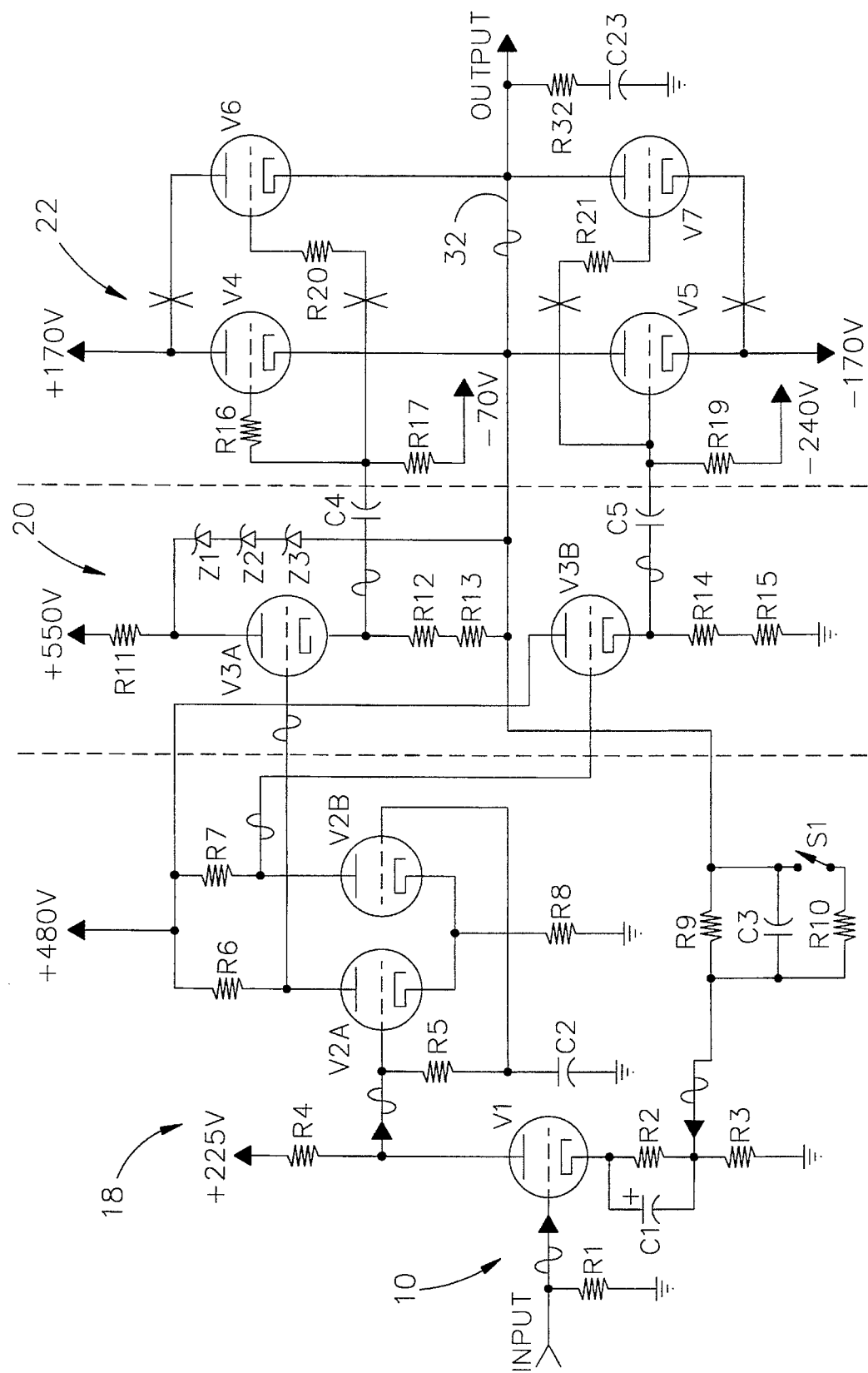
FIG. 3 is an electrical schematic of the amplifier of the preferred design.
Figure 4:
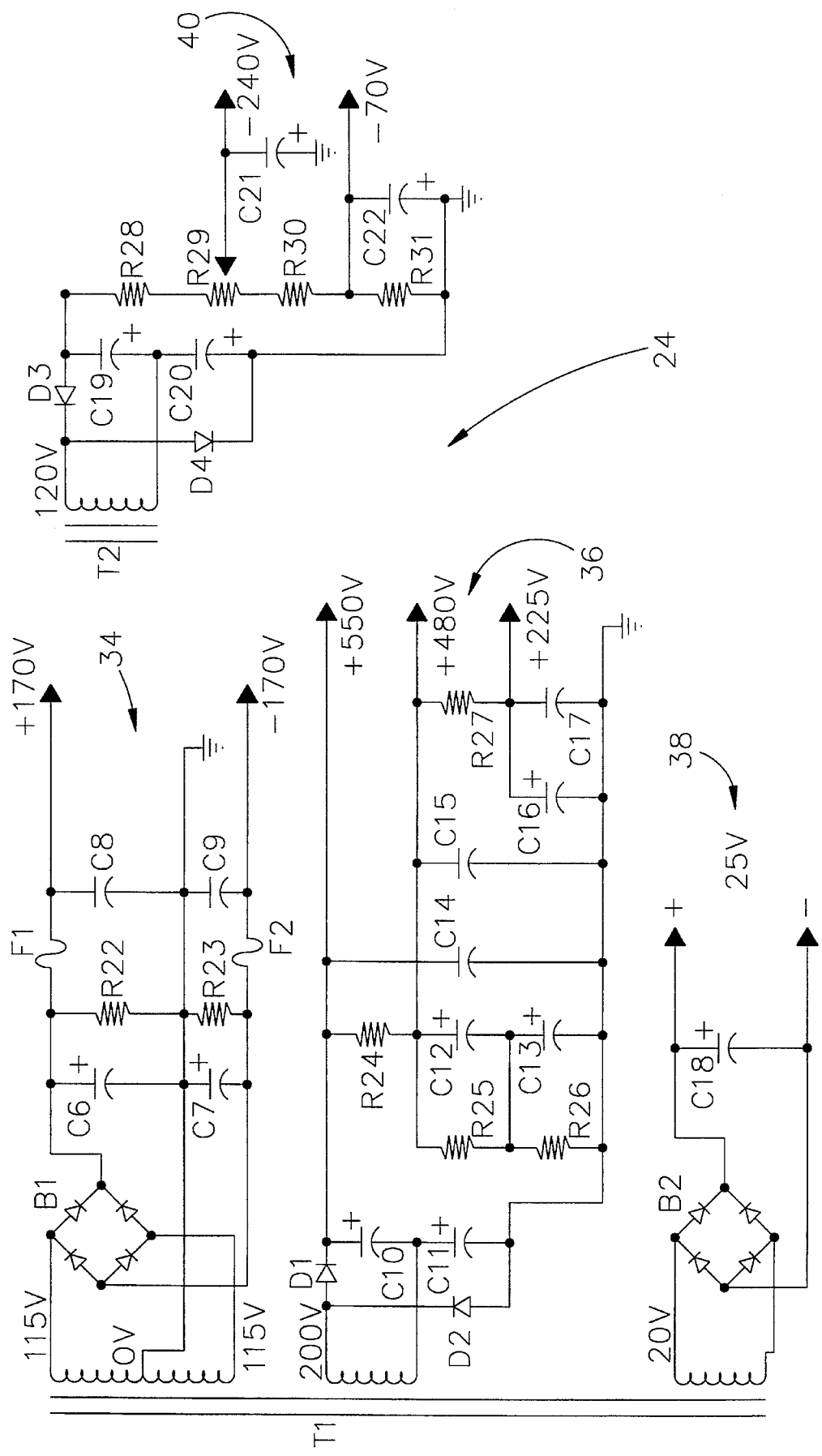
FIG. 4 is an electrical schematic of the preferred amplifier's power supply.

FIG. 3 presents an electrical schematic of the amplifier 10 except for power supply 24 shown in FIG. 4. Triode V1 (type 12AX7A) receives the audio signal at its grid. Resistor R1 (100K) is coupled between the grid of V1 and ground which provides an input impedance of 100K. Series-coupled resistors R2 (3K) and R3 (100 ohms) are coupled between the cathode of V1 and ground and create a negative bias voltage of 1.3 VDC by virtue of the idle current flowing through the tube. Capacitor C1 (100 µf–25 V), connected in parallel with resistor R2, provides an AC bypass to minimize local degenerative feedback in V1. Resistor R. (220K) is coupled between the +225 volt supply and plate of triode V1 where the output signal for V1 is developed. The voltage gain for V1 is about 70 times. The DC potential at the plate of V1 is about 125 volts which is used to set the bias of the next stage.

The node between resistors R2 and R3 provides the injection point for global negative feedback from output line 32 by way of resistors R9 and R10 (3K each) and capacitor C3 (1500 pf–500 V). Switch S1 connects R10 in parallel with R9 and C3. With switch S1 closed, the amplifier has a forward voltage gain of 22 db. With S1 open, the amplifier has a forward voltage gain of 28 db. Capacitor C3 is sized to provide a slightly over-damped response to minimize ringing when driving highly capacitive loads such as electrostatic speakers.

Triodes V2A and V2B (type 12AU7A) are connected as a cathode coupled phase splitter. The cathodes of V2A and V2B are connected together and to one end of resistor R8 (15K–2 W). The other end of R8 is grounded. The grid of V2A is directly coupled to the plate of V1. The grid of V2B is grounded through capacitor C2 (0.1 µf–630 V) and connected to the grid of V2A through resistor R5 (1M). Resistors R6 (33 k–2 W) and R7 (39K–2 W) connect the plates of V2A and V2B to the power supply voltage of 480 V. They are staggered in value to allow the phase splitter to produce two out of phase signals equal in amplitude. The phase splitter has a gain of about seven times and can produce highly linear outputs of 200 volts peak to peak. The DC potential at the plates of V2A and V2B is about 280 volts which is used to set the bias of the next stage.

Drive signal compensation stage 20 is comprised of two cathode followers, each direct coupled to one output of the phase splitter. Triode V3B has its cathode connected to ground through series coupled resistors R14 and R15 (both 33K–2 W). The plate is connected to the 480 V power supply. The grid is direct coupled to the plate of V2B. Capacitor C5 (1.0 µf–630 V) is coupled to the cathode of V3B and serves to isolate the DC voltage on the cathode from the negative bias voltage of the output stage. Triode V3A has its cathode connected to output line 32 through series coupled resistors R12 and R13 (both 33K–2 W). The grid of V3A is direct coupled to the plate of V2A. The plate of V3A is connected to the output line 32 by way of a 450 volt shunt type voltage regulator comprised of three zener diodes Z1, Z2, and Z3 (all 150 volt–5 W). The plate of V3A is also coupled to the 550 volt power supply through resistor R11 (10K–2 W). Capacitor C4 (1.0 µf–630 V) connected to the cathode of V3A serves to isolate the DC potential on the cathode from the negative bias voltage of the output stage. The voltage gain of stage 20 is about 0.95.

The output stage 22 is a series connected push-pull configuration. Triodes V4 and V5 (type 6C33C-B) yield a power output of 35 watts. An identical pair of triodes V6 and V7 with resistors R20 and R21 (both 100K) are added in parallel at the "X's" shown in FIG. 3 for the 110 watt design. The cathodes of V4 and V6 are connected to the ouput line. The plates of V5 and V7 are also connected to the output line. The grids of V4 and V6 are coupled to C4 through resistors R16 and R20 (100K each) respectively and receive the compensated drive signal. The grids of V5 and V7 are coupled to C5 through resistors R18 and R21 (100 k each) respectively and receive the uncompensated drive signal. Negative bias voltage is injected into the node of C4, R16, and R20 through resistor R17 (100K) and into the node of C5, R18, and R21 through R19 (100K). The bias voltage applied to R17 is –70 volts and is fixed. The bias voltage applied to R19 is nominally –240 volts and is adjustable. The bias voltage at R19 is 170 volts more negative than the bias at R17 to compensate for the cathodes of V5 and V7 being held at –170 volts. The loudspeaker is directly coupled to output line 32 without any intervening active or passive devices. Output stage 22 has a voltage gain of about 0.25. Resistor R32 (7.5–2 W) and capacitor C23 (0.1 µf–630 V) are series connected between the output line 32 and ground. They form a constant load impedance for ultrasonic frequencies.

THEORY OF OPERATION

Stage 18 is a conventional two stage voltage amplifier-phase splitter that has been used in vacuum tube audio power amplifiers since the 1940's. Critical performance parameters for stage 18 are that it must produce two linear out of phase audio signals, each with a maximum peak to peak amplitude of 200 volts, and have a forward voltage gain of about 500 times. Those individuals skilled in the art appreciate that a circuit with lower or higher voltage gain will still work but will alter the performance characteristics of the amplifier. It is also important that section 18 be direct coupled because any additional AC couplings would cause low frequency phase shift leading to instability and motorboating. Different vacuum tube circuit configurations are possible so long as they provide sufficient gain, amplitude, and phase linearity. It is recognized by those individuals skilled in the art that a circuit using solid state components could also be used for section 18. This would alter the sonic characteristics of the amplifier but is a viable way to drive the series connected vacuum tube output stage.

Stage 20 is the intermediate stage that contains the drive signal compensation which is the basis of the invention. Two cathode followers are required to provide symmetry and for equal phase shift and impedance for the two push pull drive signals. Triode V3A applies the required feedback compensation to triodes V4 and V6 while triode V3B provides no signal compensation to triodes V5 and V7. It is noted that cathode follower V3B could be omitted and the circuit will still function. If omitted, the time and phase characteristics of both push-pull drive signals will not be equal which will cause a deterioration in performance. Stage 20 must have a gain of unity because 100% positive feedback compensation is applied to overcome the 100% degenerative feedback in the output stage. Cathode followers are used because they have a voltage gain of essentially unity. Vacuum tubes have been used for stage 20 but it is recognized by those individuals skilled in the art that solid state devices could also be employed.

It is recognized by those individuals skilled in the art that two closed loop unity gain stages consisting of multiple active devices could be used in place of the cathode followers. These closed loop stages could be constructed of vacuum tubes or solid state devices.

In order for a triode to operate as a unity gain cathode follower, its plate must be connected to ground through a very low impedance path. In a conventional application this path would be provided by the power supply. Since the cathode resistor of V3A is not grounded but connected to the output line, this low impedance path must be incorporated by some other means. One technique that has been tried is to connect the plate of V3A to the output line through a large capacitor. This produces excellent measurable results but the sound quality of the amplifier is very harsh and unpleasant. It has been discovered that the DC potential between the plate of V3A and the output line must remain fixed in order to produce high quality sound. A voltage regulator can provide both a low impedance path as well as fixing the DC potential with a high degree of accuracy.

The amplifier uses a two terminal shunt type regulator. A three terminal series pass type regulator will also provide excellent results but is more complicated and increases cost. It is recognized by those individuals skilled in the art that the voltage regulator could be comprised of zener diodes, gas tubes, vacuum tubes, or other solid state devices. The zener diodes used in the invention provide the lowest cost method to implement the voltage regulator with a very high degree of reliability.

The quiescent voltage drop across resistor R11 is a critical parameter. As the output line goes positive with the audio signal, the voltage on the cathode and plate of V3A rise in step with it. The voltage drop across R11 decreases by the same amount as the rise on the output line. Hence sufficient voltage headroom must be present in the drop across R11 or else premature clipping will occur. The amplifier uses a voltage drop of 100 volts across R11 which is sufficient to achieve full power and not drive the cathode follower into cut off.

The primary function of grid resistors R16, R18, R20 and R21 is to prevent parasitic oscillation from occurring caused by the low impedance of the cathode followers and the input capacitance of the output tubes. A value of 10K ohms provides stable operation. It has been discovered that a 10K value causes the sound to be extremely harsh and irritating. The –3 db point for the output stage with 10K ohm grid resistors is about 250 kHZ. When these resistors are increased to 36K ohms, the sound quality begins to markedly improve. The amplifier uses 100K ohm grid resistors which cause the sound to be very pleasant and musical. The –3 db point for the output stage with 100K ohm grid resistors is about 30 kHZ. This improvement in sound quality with large value grid resistors is unique and specific to the 6C33C-B type triode used in this amplifier. No other vacuum tubes have been found that duplicate this effect.

THE POWER SUPPLY

Power supply 24 shown in FIG. 4 includes output section 34, drive section 36, filament heater section 38 and bias section 40. Transformer primaries are conventional (not shown). Output section includes a center tapped 230 volt winding from transformer T1 feeding a 35 amp-600 V full-wave bridge rectifier B1. Series connected capacitors C6 and C7 (6000 μf–200 V each) provide the filtering. Resistors 22 and 23 (20K–5 W each) are discharge resistors for capacitors C6 and C7. Fuses F1 and F2 (4 amps fast blow each) protect the output stage and speaker against faults. Capacitors C8 and C9 (1 μf–250 V each) are bypass capacitors needed to create a good AC ground at high frequencies. The output voltages are +/–170 volts at idle and +/–155 volts at full load.

Drive section receives 200 VAC from transformer T1. Diodes D1 and D2 (1 A–1000 V each) form a voltage doubler in combination with capacitors C10 and C11 (22 μf–350 V each). The resultant 550 volts DC is applied to V3A. Resistor R24 (5K–5 W) reduces the voltage to +480 VDC for V2A, V2B, and V3B where capacitors C12 and C13 (210 μf–350 V each) provide the filtering. Resistors R25 and R26 (300K each) equally divide the voltages across capacitors C12 and C13. Capacitor C14 (0.1 μf–630 V) provides a high frequency bypass for V3A and capacitor C15 (0.47 μf–630 V) provides high frequency bypass for V2A, V2B, and V3B. Resistor R27 (620K) drops the voltage to +225 VDC for V1 and capacitor C16 (22 μf–450 V) provides the filtering while capacitor C17 (0.1 μf–630 V) provides a high frequency bypass.

Filament heater section 38 receives 20 VAC from Transformer T1 which is supplied to full wave bridge B2 (35 A–200 V). Capacitor C18 (20,000 μf–40 V) provides the filtering with the output being 25 VDC to the filaments of the vacuum tubes in amplifier 12. The tubes having 12.6 V filaments are wired in series to utilize the 25 VDC power supply. Filament connections are conventional (not shown).

Bias section 40 provides the bias voltages for the output tubes at –240 VDC and –70 VDC. Stable bias is important and because of this, this power supply section is supplied with its own separate transformer T2 (120 V–50 mA) to provide better regulation.

In section 40, diodes D3 and D4 (1 A–1000 V) form a voltage doubler in combination with capacitors C19 and C20 (22 μf–350 V each). Resistor R28 (39K–2 W) drops the voltage to –240 VDC for the bias on tubes V4 and V7. Capacitor C21 (22 μf–350 V) provides the filtering. Potentiometer R29 (10K–0.5 W) provides a range of adjustment of 30 volts to balance output stage 22 for 0 volts on output line 32. Resistors R30 (53.6K) and R31 (24K) provide a fixed potential of –70 VDC for the bias on tubes V4 and V6. Capacitor C22 (22 μf–350 V) provides the filtering.

SUMMARY RAMIFICATIONS, AND SCOPE

Accordingly, it can be seen that the amplifier of this invention provides truly balanced drive signals to the series connected vacuum tube output stage resulting in a low heat, reliable, transformerless output vacuum tube amplifier with excellent bass sound.

Although the description above contains many specificities, these should not be construed as limiting the scope of the invention but as merely providing illustrations of some of the presently preferred embodiments of the invention. For example, any of the circuit stages could be constructed of solid state devices or use vacuum tube based circuits of differing topology that achieve the same functional results; the floating voltage regulator could be three terminal series pass as well as two terminal shunt type or replaced with a capacitor; driver circuits of lessor or greater voltage gain could be used; the output stage could use a single-ended power supply with an AC coupled output; different output tubes could be used; high bias current or class A type output stage could be used; a transformer could be connected to the output stage for further output impedance reduction; closed loop feedback could be eliminated; different power supply voltages could be used.

Thus the scope of the invention should be determined by the appended claims and their legal equivalents, rather than by the examples given.

I claim:

1. An audio amplifier comprising:

a gain stage including means for receiving an audio input from a source thereof and responsive to said input for producing first and second amplified audio signals 180 degrees out of phase from one another;

an intermediate stage including first and second intermediate unity gain sections having means for respectively receiving said first and second amplified audio signals and responsive thereto for producing respective first and second intermediate signals;

an output stage including first and second series connected vacuum tubes coupled in a push-pull configuration, and including means for setting the quiescent current of said first and second series connected vacuum tubes, and for receiving and responding to said first and second intermediate signals for producing an output signal on an output line, said output stage being operable for driving an audio loudspeaker coupled with said output line without a transformer and without a capacitor between said output stage and said audio loudspeaker;

said first and second series connected vacuum tubes being coupled for respectively receiving at the grids thereof said first and second intermediate signals and responsive thereto for respectively producing said output signal;

the cathode of said first series connected output tube being coupled with said output line so that said cathode follows said output signal resulting in degeneration of said first intermediate signal at said grid of said first series connected vacuum tube relative to said output line; and means for compensating for said degeneration including means for providing said output signal as a voltage reference for said first intermediate unity gain section so that said output signal is superimposed only on said first intermediate signal thereby compensating for said degeneration.

2. The amplifier as set forth in claim 1, said gain stage including means for providing a gain of about 500 for said first and second amplified audio signals relative to said input.

3. The amplifier as set forth in claim 2, said gain means including vacuum tubes.

4. The amplifier as set forth in claim 1, said means for said first and second intermediate unity gain sections including vacuum tube cathode followers.

5. The amplifier as set forth in claim 4, the plate of said first intermediate vacuum tube cathode follower be coupled to said output line by means of low impedance device.

6. The amplifier as set forth in claim 5, said low impedance device further providing a constant voltage drop.

7. The amplifier as set forth in claim 5, said low impedance device means including a voltage regulator.

8. The amplifier as set forth in claim 6, said constant voltage drop of about 450 volts direct current.

9. The amplifier as set forth in claim 7, said voltage regulator including at least one shunt type zener diode.

10. The amplifier as set forth in claim 4, the cathode of said first intermediate vacuum tube cathode follower be coupled to said output line by way of resistance so that said output line provides a floating voltage reference to said cathode of said first intermediate vacuum tube cathode follower.

11. The amplifier as set forth in claim 4, the cathode of said second intermediate vacuum tube cathode follower be coupled to ground by way of resistance.

12. The amplifier as set forth in claim 1, said first and second intermediate signals each presenting about 200 volts peak to peak.

13. The amplifier as set forth in claim 1, said first and second series connected vacuum tubes respectively receiving said first and second intermediate signals by way of respective first and second grid resistance, each being greater than about 36K ohms.

14. The amplifier as set forth in claim 13, said first and second grid resistance each being about 100K ohms.

15. The amplifier as set forth in claim 13, said first and second series connected vacuum tubes being type 6C33CB triodes.

16. The amplifier as set forth in claim 1, further including feedback means for providing negative feedback from said output line to said gain stage.

17. The amplifier as set forth in claim 1, said output stage including means for operating in substantially class B mode.

18. The amplifier as set forth in claim 1, further including at least one pair of said series connected vacuum tubes.

19. The amplifier as set forth in claim 1, said means for setting said quiescent current of said first and second series connected vacuum tubes includes injecting negative bias voltage into said grids of said first and second series connected vacuum tubes, respectively.

20. The amplifier as set forth in claim 1, said output stage further includes means of setting quiescent voltage on said output line to zero volts by fixing said negative bias voltage on said grid of one said series connected vacuum tube and varying said negative bias voltage on said grid of other said series connected vacuum tube.

* * * * *